United States Patent [19]

Gurne et al.

[11] Patent Number: 5,541,840

[45] Date of Patent: Jul. 30, 1996

[54] HAND HELD AUTOMOTIVE DIAGNOSTIC SERVICE TOOL

[75] Inventors: Krzysztof Gurne, Warren; Raymond J. Williams, Farmington Hills; John R. Boldt, Troy; Robert L. Barker, Auburn Hills; Gregory J. Broniak, Oxford; Daniel J. Marus, Rochester Hills, all of Mich.

[73] Assignee: Chrysler Corporation, Auburn Hills, Mich.

[21] Appl. No.: 83,050

[22] Filed: Jun. 25, 1993

[51] Int. Cl.⁶ .................................................. G06F 17/40
[52] U.S. Cl. ................... 364/424.03; 73/118.1; 364/551.01
[58] Field of Search .................. 364/424.03, 424.04, 364/550, 551.01; 73/117.3, 117.4, 118.1; 340/438, 459; 371/29.1

[56] References Cited

U.S. PATENT DOCUMENTS

| | | | |
|---|---|---|---|
| Re. 31,582 | 5/1984 | Hosaka et al. | 364/424.04 |
| 4,234,921 | 11/1980 | Kinoshita et al. | 364/424.03 |
| 4,375,672 | 3/1983 | Kato et al. | 364/424.03 |
| 4,602,127 | 7/1986 | Neely et al. | 364/431.03 X |
| 4,694,408 | 9/1987 | Zaleski | 364/551.01 |
| 4,831,560 | 5/1989 | Zaleski | 364/551.01 |
| 4,853,850 | 8/1989 | Krass, Jr. et al. | 364/424.04 |
| 4,866,616 | 9/1989 | Takeuchi et al. | 364/424.03 |
| 4,962,456 | 10/1990 | Abe et al. | 364/424.03 X |
| 4,964,049 | 10/1990 | Abe et al. | 364/551.01 |
| 4,975,846 | 12/1990 | Abe et al. | 364/424.03 |
| 4,975,847 | 12/1990 | Abe et al. | 364/424.03 |
| 5,003,476 | 3/1991 | Abe | 364/424.03 |
| 5,003,477 | 3/1991 | Abe et al. | 364/424.03 |
| 5,056,023 | 10/1991 | Abe | 364/424.03 |
| 5,058,044 | 10/1991 | Stewart et al. | 364/551.01 |
| 5,077,670 | 12/1991 | Takai et al. | 364/424.03 |
| 5,107,428 | 4/1992 | Bethencourt et al. | 364/424.03 |
| 5,132,905 | 7/1992 | Takai et al. | 364/424.03 |
| 5,365,436 | 11/1994 | Schaller et al. | 364/424.03 |

OTHER PUBLICATIONS

Chrysler 1983–1988 Instruction Manual, OTC Tool & Equipment Division Sealed Power Corporation, Feb. 1988, entire book.

1990 Domestic 3 in 1 Monitor 4000E Manual, OTC Tool & Equipment Division SPX Corporation, Apr. 1990, entire book.

MPSI Pro–Link 9000 Manual for Chrysler System. 1988.

Chrysler Reference Manual for Snap–On Scanner and 1990 Supplement.

*Primary Examiner*—Collin W. Park
*Attorney, Agent, or Firm*—Mark P. Calcaterra

[57] ABSTRACT

The present invention relates to a system and method for diagnosing and isolating problems and for monitoring operting conditions on an automobile. The system includes a hand held unit and a master station which can operate alone or in unison to accomplish functions such as logging and displaying data on a real-time basis, logging data remotely and displaying the data at a later time, diagnosing fault conditions, monitoring operating parameters, reprogramming on-board vehicle controllers, displaying service manual and service bulletin pages and ordering parts online.

8 Claims, 14 Drawing Sheets

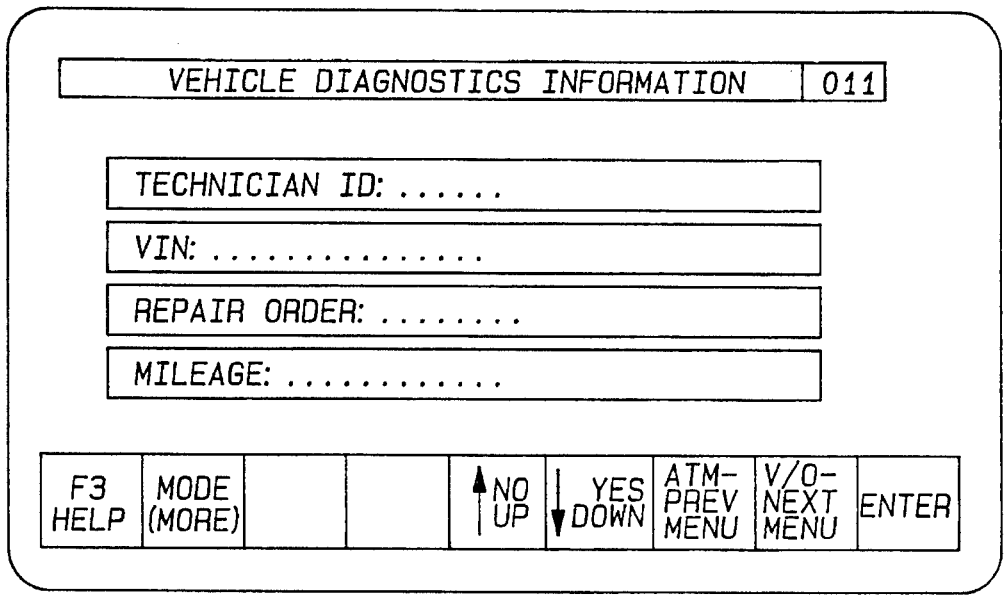
Fig-17
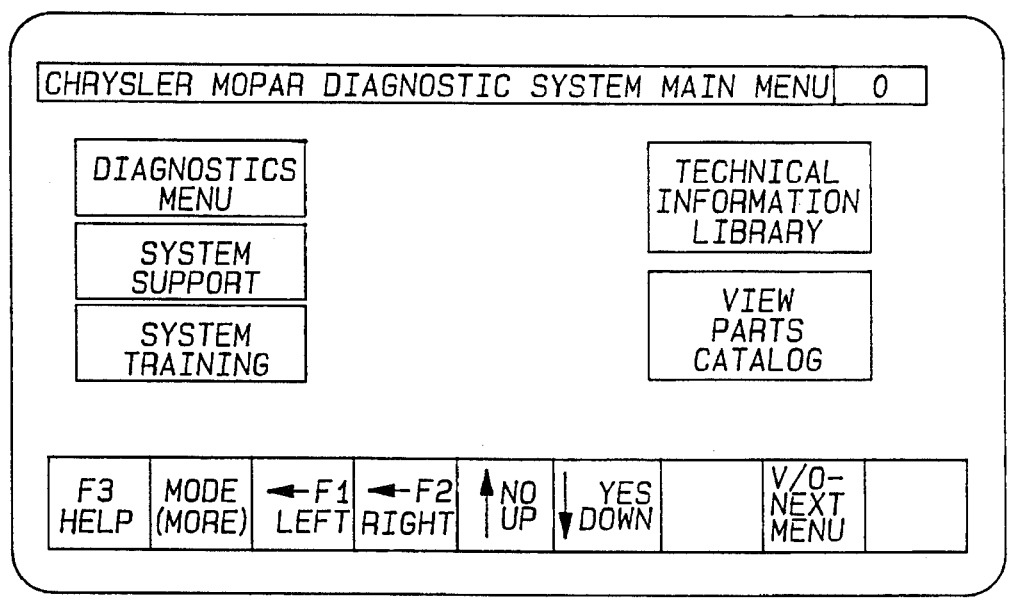
Fig-8

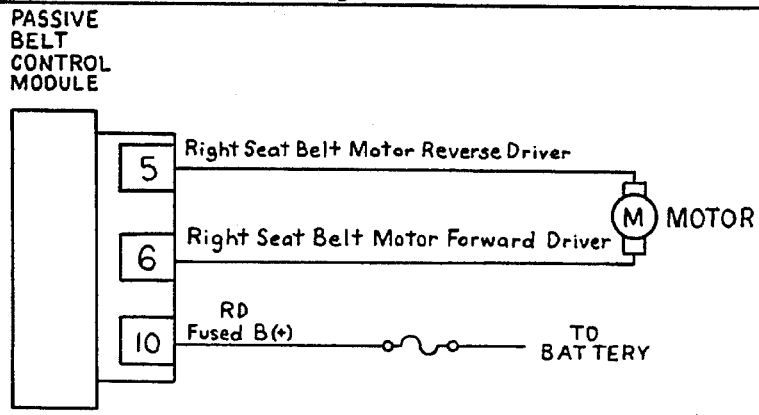
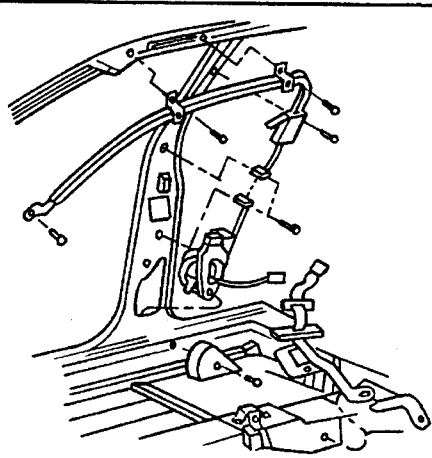
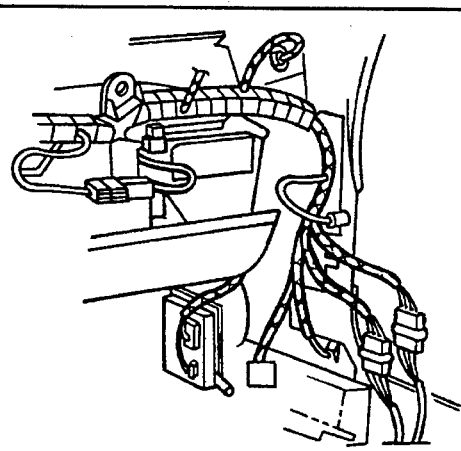
FIG-1    FIG-2
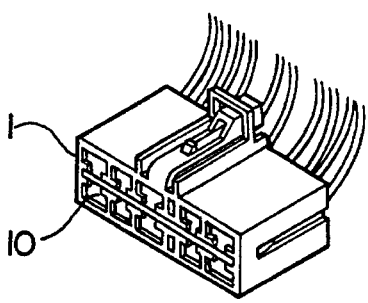
| CAV | COLOR | FUNCTION |
|---|---|---|
| 1 | YL | RIGHT SEAT BELT MOTOR RESERVE DRIVER |
| 5 | BK | GROUND |
| 6 | RD | FUSED B(+) |
| 10 | LB | RIGHT SEAT BELT MOTOR FORWARD DRIVER |
FIG-3
*Fig - 11*

Fig-16

MAKE TEMPLATE-SELECT VEHICLE DATA ITEMS | D4200-01

TEMPLATE ID:        TECHNICIAN:              FRAME TIME:
TEMPLATE NAME:
VEHICLE DESCRIPTION:

```
MAP VACUUM              TPS VOLTS               ENGINE RPM              LEFT LONG TERM ADAP%
LEF INJECTOR BANK PW    LEFT O2S BANK VOLTS     DTC START COUNTER       RGT INJECTOR BANK PW
RIGHT LONG TERM ADAP%   LEFT IDLE ADAP BANK     RIGHT IDLE ADAP BANK    RIGHT O2S BANK VOLTS
DTS COUNTER             BAROMETRIC PRESSURE     MAP VOLTS               TPS CALCULATED VOLTS
MINIMUM TIPS            ENG COOLANT TEMP DEG    ENG COOLANT TMP VOLT    BAT TEMP SENSOR DEG
INTAKE AIR TEMP DEG     INTAKE AIR TMP VOLT     VOLTAGE SENSE           IAC STEPS
TARGET IDLE             SPARK ADVANCE           VEHICLE SPEED SENSOR    2-3 LOCK OUT LAMP
2-3 LOCK OUT SOL        BRAKE SWITCH            RAD FAN CONTROL RLY     EVAP PURGE SOLENOID
CAMSHAFT POS SENSOR     CRANKSHAFT POS SENSOR   AUTO SHUTDOWN RELAY     ALARM FUEL STATUS
ALARM SIGNAL STATUS     CLOSED LOOP STATUS      TROUBLE CODE/SEC 1
```

| F3   | MODE   | ←F1       | ←F2        | ↑NO  | ↓YES   | ATM-  | V/O-  |
| HELP | (MORE) | LEFT      | RIGHT      | UP   | DOWN   | PREV  | NEXT  |
|      |        |           |            |      |        | MENU  | MENU  |

HAND HELD AUTOMOTIVE DIAGNOSTIC SERVICE TOOL

BACKGROUND OF THE INVENTION

1. Field of the Invention

This invention relates generally to a system and method for monitoring automobile operating parameters and for diagnosing operational errors, and more particularly to a system and method for retrieving diagnostic codes from automotive control systems, for monitoring automotive operating parameters, for performing diagnostic inquiries, and for logging and later downloading operational variables.

2. Description of the Related Art

In the field of automotive service, it has become increasingly important to be able to monitor the operation of major automobile systems, such as the engine, transmission and braking system, on a real-time basis for diagnosing and repairing operational problems. Since these major systems are now usually controlled, either entirely or in part, using an microcomputer, the on-board ability of the controllers to store operational information and error codes for later retrieval has been exploited to improve the accuracy with which service personnel diagnose problems. However, these controllers have limited on-board memory for storing these operation parameters. Moreover, relying solely upon on-board capabilities does not allow the service procedures to adapt to information learned after the product has been out in the field for a while. Thus, it is preferable to supplement on-board capabilities with auxiliary diagnostic systems.

One commonly employed auxiliary diagnostic system is commonly known as a "scan tool." The scan tool is typically hand-held and interfaces to the automobiles on-board controllers via the vehicle communication bus, usually tapping in to the bus at a connection point located beneath the dashboard. For a scan tool to be a truly effective aid in diagnosing problems, the scan tool must be able to communicate, or "talk," to the various on-board controllers, regardless of whether the controller is manufactured by the automobile manufacturer or a supplier company.

One disadvantage of currently available scan tools is their inability to accommodate a wide variety of automobile models without requiring substantial hardware or software modification. For most dealerships or service stations, requiring the service technician to stock different scan tools for use on different vehicles is undesirable for reasons of cost, limited storage space and difficulty for the service technician in remembering how to use each of these different scan tools. Most currently available scan tools also rely upon fault trees printed in service manuals for guiding the technician through diagnostic steps. These printed service manuals are costly to prepare and distribute, and become soiled and torn through repeated use. The manner in which these service manuals are supplemented is often problematic, because these manuals are usually bound volumes and do not permit the easy substitution of updated pages.

A concern of service personnel and automobile manufacturers alike is the need to ensure problems are diagnosed accurately and promptly. For the service technician, the customer who brings the vehicle in for service often has a very vague description of the problem ("it makes a clickity noise sometimes") that is not currently manifesting itself when the vehicle is brought in and that the technician finds difficult to recreate. It would be easier for the technician to accurately diagnose the cause of a problem if he can monitor the operating conditions of the vehicle while the problem is manifesting itself. However, this is difficult to achieve because the technician cannot easily drive around with the customer and the customer cannot afford to leave the vehicle with the technician for days at a time. For the technician, it is often expedient to simply replace parts which seem to be the likely culprits in the hopes that the tried-and-true method will solve the problem. However, this increases warranty costs to the manufacturer, because parts that may not be faulty are replaced regardless. Also, when parts are replaced and the problem still remains, the customer become frustrated and often vents this frustration on dealership personnel. Therefore, it would be preferable if tools were provided to the technician which improves his ability to monitoring problems as they occur and to accurately diagnose and repair the cause of the problem. Since scan tools are fairly familiar to technicians, a scan tool which provides these added features would prove very helpful.

SUMMARY OF THE INVENTION

It is therefore an object of the present invention to provide a system and method for monitoring the operation of a vehicle on a real-time basis, and for providing sophisticated problem solving capabilities for accurately diagnosing and repairing problems. The present invention employs a handheld scan tool and a master station to provide improved service support and capabilities. The scan tool of the present invention is adapted to interface to the automobile and communicate with the various on-board controllers to monitor the operation of the vehicle on a real-time. The scan tool is adapted to be compatible with a wide variety of makes and models of automobiles and vehicle systems, reducing the need to replace scan tools as model years change. The scan tool can be updated quickly and easily from the master station or from memory cartridges. The master station of the present invention is adapted to interface to the scan tool and provides sophisticated updating and diagnostic capabilities not feasible to include in the scan tool itself. The master station reduces the need to rely upon printed service manuals when using the scan tool, reducing printing and distribution costs. The scan tool is further adapted to provide data storage capabilities, allowing the status of monitored operating parameters to be logged and downloaded later for inquiry. The master station can plot and interpret vehicle information from the scan tool, whether real-time or logged, to aid the technician in diagnosing the cause of a problem.

One advantage of the present invention is that it is suited for use in conjunction with a wide variety of automobiles and automotive controllers, reducing the need to replace scan tools as model years change and reducing the need to carry several different scan tools for communicating with different controllers. Another advantage of the present invention is that the logging capabilities allow the technician or the customer to drive the automobile while monitoring and recording operation parameters as the problem occurs. Still another advantage is that the master station allows the scan tool to be updated quickly without requiring new scan tools to be purchased when service information is updated. Another advantage is that the master station reduces the reliance upon printed service manuals and loose page service updates.

BRIEF DESCRIPTION OF THE DRAWINGS

Other objects, features and advantages of the present invention can be appreciated by referencing the following description of the presently preferred embodiment in conjunction with the drawings, where:

FIG. 8 is an illustration of the main master station menu screen;

FIG. 11 is an illustration of a sample display screen from the master station showing technical information used during diagnostics;

FIG. 16 is an illustration of the master station screen as a custom template is being built;

FIG. 17 an illustration of the service update screen; and

DESCRIPTION OF THE PRESENTLY PREFERRED EMBODIMENT

Figure 1:
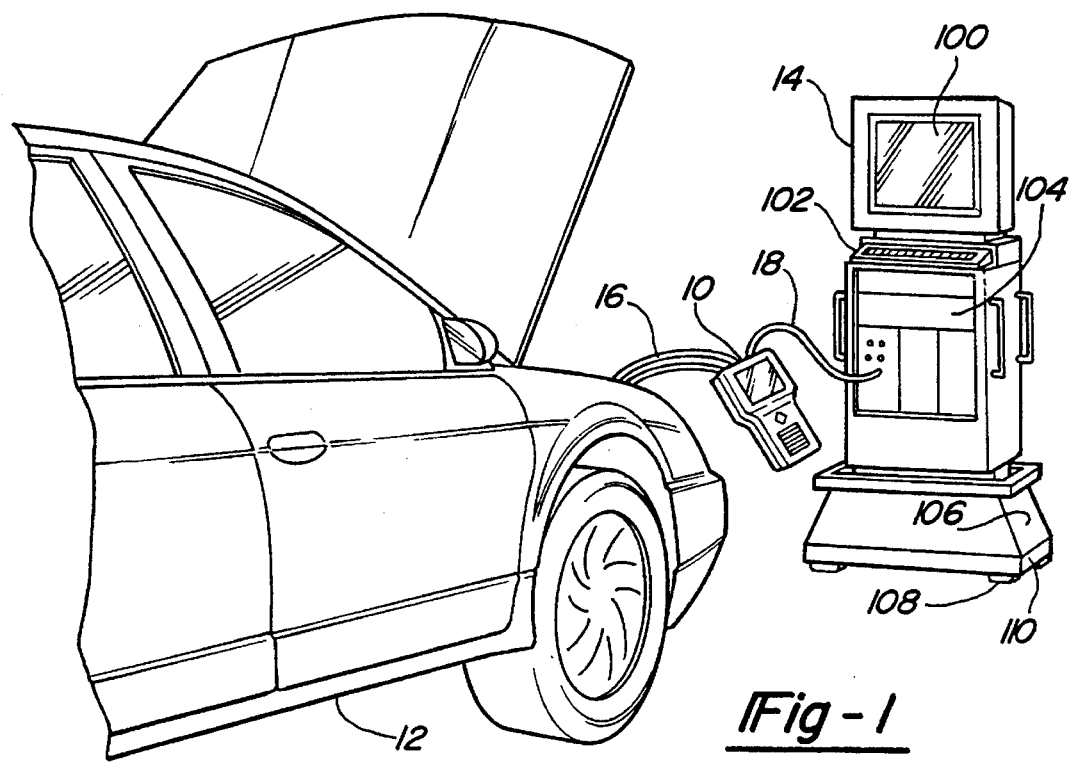
FIG. 1 is an illustration showing how the scan tool interfaces to the automobile and master station.

As can be seen in FIG. 1, the system of the presently preferred embodiment includes the hand held unit 10 which connects to the car 12 and the master station 14 via cables 16, 18. The hand held unit 10 has specialized hardware and software on board for communicating with the various controllers on the car. As will be described in greater detail, the hand held unit 10 is capable of operating as a scan tool, volt-ohm meter, and data logging unit by itself without requiring support from the master station. When the master station 14 is connected 18 to the hand held unit 10, the hand held unit can serve as a smart interface between the master station 14 and the various controllers on the car 12. The master station itself is capable of downloading alternative diagnostic routines to the hand held unit 10 as needed, while also providing the ability to update and/or reconfigure the internal memory of the hand held unit. The master station further provides interactive data charting capabilities. The master station 14 also serves as a paperless service manual, providing detailed pictorial and textural service information. These and other features of the hand held unit 10 and the master station 14 will be described now in greater detail.

Hand Held Unit

Figure 2:
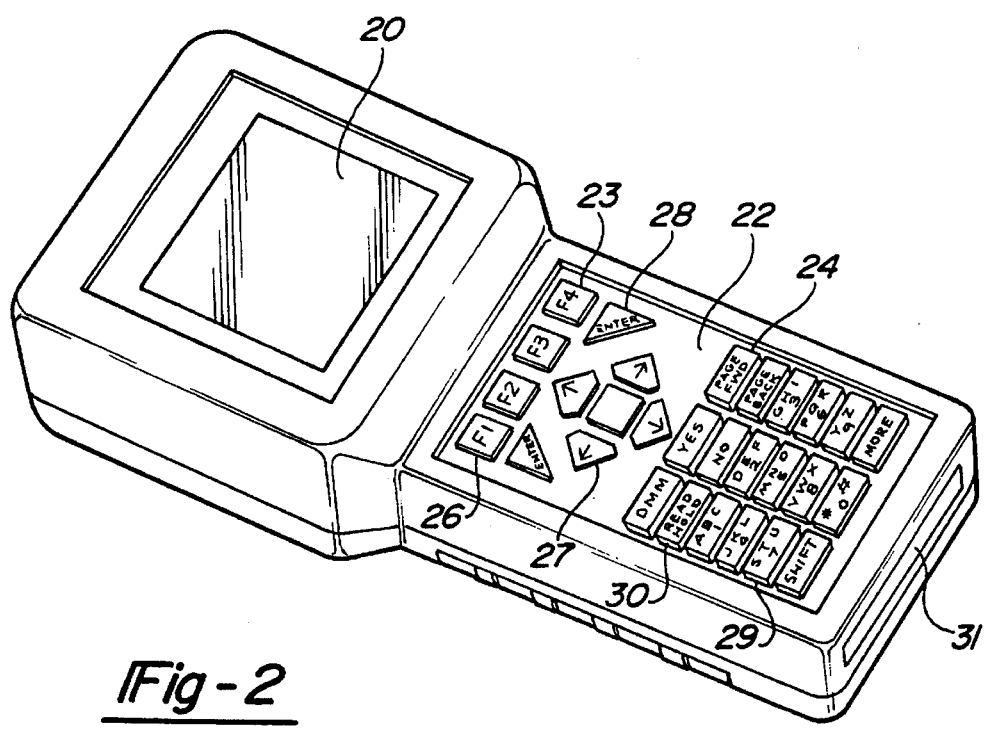
FIG. 2 is an orthogonal illustration of the appearance of the scan tool.
Figure 3:
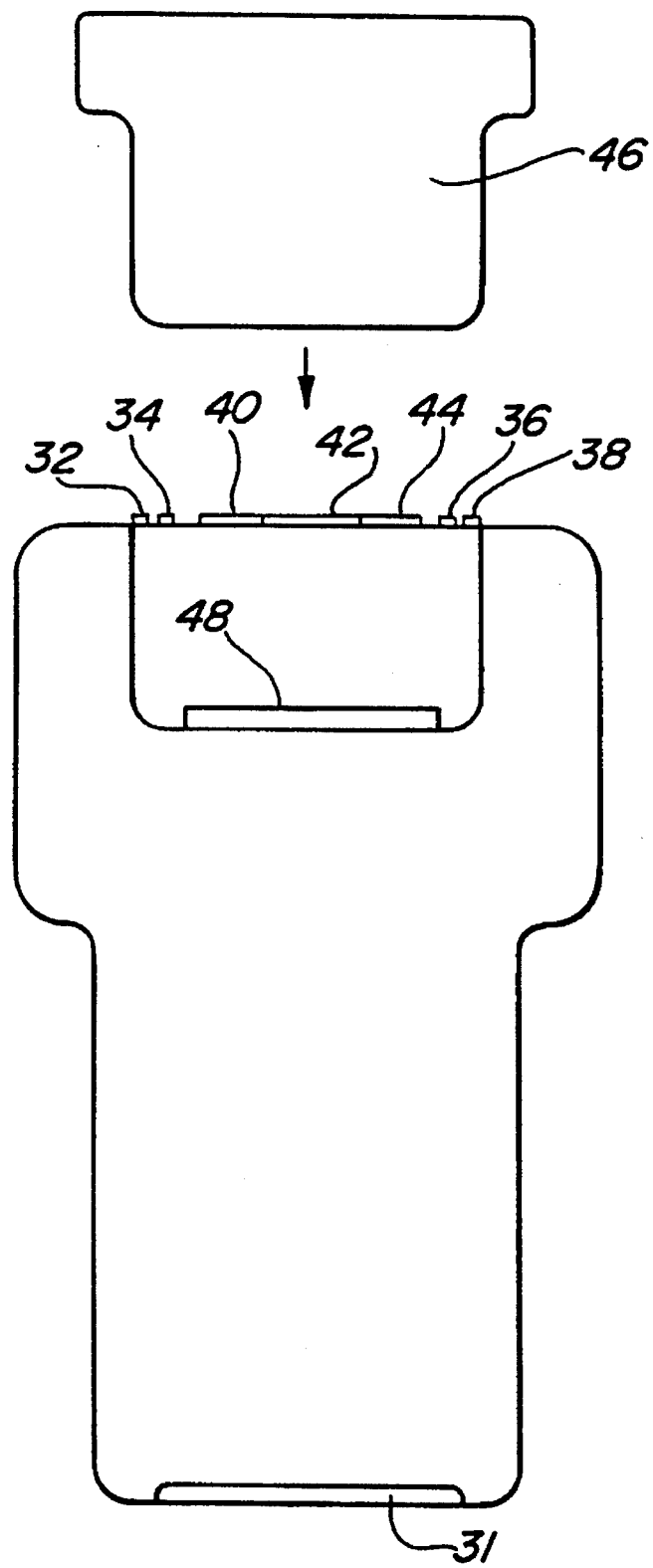
FIG. 3 is a plan illustration of the appearance of the back of the scan tool.

As can be seen better in FIGS. 2 and 3, the hand held unit 10 is approximately 14 inches long, 6 inches wide, 2½ inches tall and weighs approximately 4 lbs. The face of the hand held unit includes a display screen 20 and a keypad 22. The display screen in this embodiment is a backlit LCD display having a resolution of 320×200 pixels, with an overall screen dimension of 4 inches wide by 3 inches tall. The screen is tilted at a slight angle to facilitate viewing from an angle, such as would occur if the unit were placed on a work table or on the car while being used. The key pad is formed from a flexible plastic membrane with the key boundaries 23 embossed and the characters 24 printed on the surface. The key pad includes four function keys 26, four directional arrow keys 27 used to parse through character strings and step through logic sequences, two enter keys 28 to indicate a command is to be entered, ten alphanumeric keys 29 for entering letters, numbers and characters, and eight special function keys 30 used for responding to queries and the like. The key pad is a membrane key pad in this embodiment because of the harsh environment in which the hand held tool operates. By utilizing a membrane, the actual key contact points are protected from contamination by dirt and moisture. Moreover, utilizing a membrane key pad helps reduce the likelihood that keystrokes are entered unintentionally.

At the base of the hand held tool 10, an expansion slot 31, approximately 2 inches long and ¼ inch wide, is adapted to receive conventional PCMCIA card memory expansion boards. The memory expansion cartridges are useful when using the hand held unit as a data logger, which will be described in greater detail later. Along the top of the hand held unit 10, there are connection points 32–38 for electrical probes, an RS-232 connection 40 for communicating with other computers and computer peripherals, a vehicle interface connection 42 and a GPIB master station interface connection 44. On the back of the hand held unit, a removable cover 46 protects a peripheral expansion port 48. As will be described in greater detail later, the peripheral expansion port accepts an expansion module which allows the hand held tool to be compatible with many other devices, such as a computer disk drive, a wider variety of vehicle controllers and other types of measurement tools.

The vehicle interface capabilities of the hand held unit will now be described in greater detail. The vehicle interface connector 42 is a thirty-six way connector. The hand held unit 10 is interfaced to the vehicle 12 via the vehicle interface cable 16. In this embodiment, the vehicle interface 44 is adapted to work with a variety of interface cables. Specifically, six different types of cables are currently supported. All of these cables, while utilizing the same thirty-six way interface, support different communication protocols. For example, an ISO 9141/CARB cable is an asynchronous full duplex serial communication link configurable to a variety of baud rates, such as 976, 7812.5, 62.5K, and 10.4K baud rates, with signal levels varying between an idle condition of twelve volts and zero volts. Similarly, an SCI-I cable is an asynchronous duplex serial communication link configurable to baud rates such as 976, 7812.5, and 62.5K baud, with the signal levels varying from an idle of zero volts to five volts. Both the SCI-I and ISO 9141/CARB communication links utilize the standard ten bit non return to zero (NRZ) data format, with one start bit, eight data bits and one stop bit. Yet another cable communicates using a contention-based, class B multiplexed bus, transferring data at 7812.5 baud via a voltage differential generated across the bus which is biased to 2.5 volts.

Because the same connector interface 42 is used to support all of these various communication protocols, the hand held tool 10 must be able to recognize which cable is connected at the interface 42 and adapt its communication protocol accordingly. In this embodiment, this is accomplished by ensuring each of the unique cables has a unique resistance associated therewith. This unique resistance is measured and recognized by the hand held unit 10 so that it may identify the cable to which it is connected and adjust its communication protocol accordingly. Specifically, in this embodiment, two pins of the connector provide the resistance signal feed. The resistance signal feed is interfaced to the control logic circuitry so that the resistance may be measured and compared to predetermined values corresponding to the unique resistances for the various cables. In this embodiment, the resistance values of the various cables have been established such that, given measurement tolerances, there is no chance of overlap between the resistance values, which may otherwise cause an erroneous cable identification. Specifically, a cable for communicating with the engine controller has a nominal resistance of 3,010 ohms, a cable for communicating with the body controller has a nominal resistance of 14,000 ohms, and the J1962 cable has a nominal resistance of 44200 ohms. Once the hand held tool 10 determines which vehicle interface cable 16 is connected to it, the hand held tool 10 adapts its communication protocol to match the protocol of the cable. This feature allows the hand held tool to be used with a wide variety of vehicles and vehicle controller systems, such as engine, transmission, anti-lock brake and body controllers.

Figure 4:
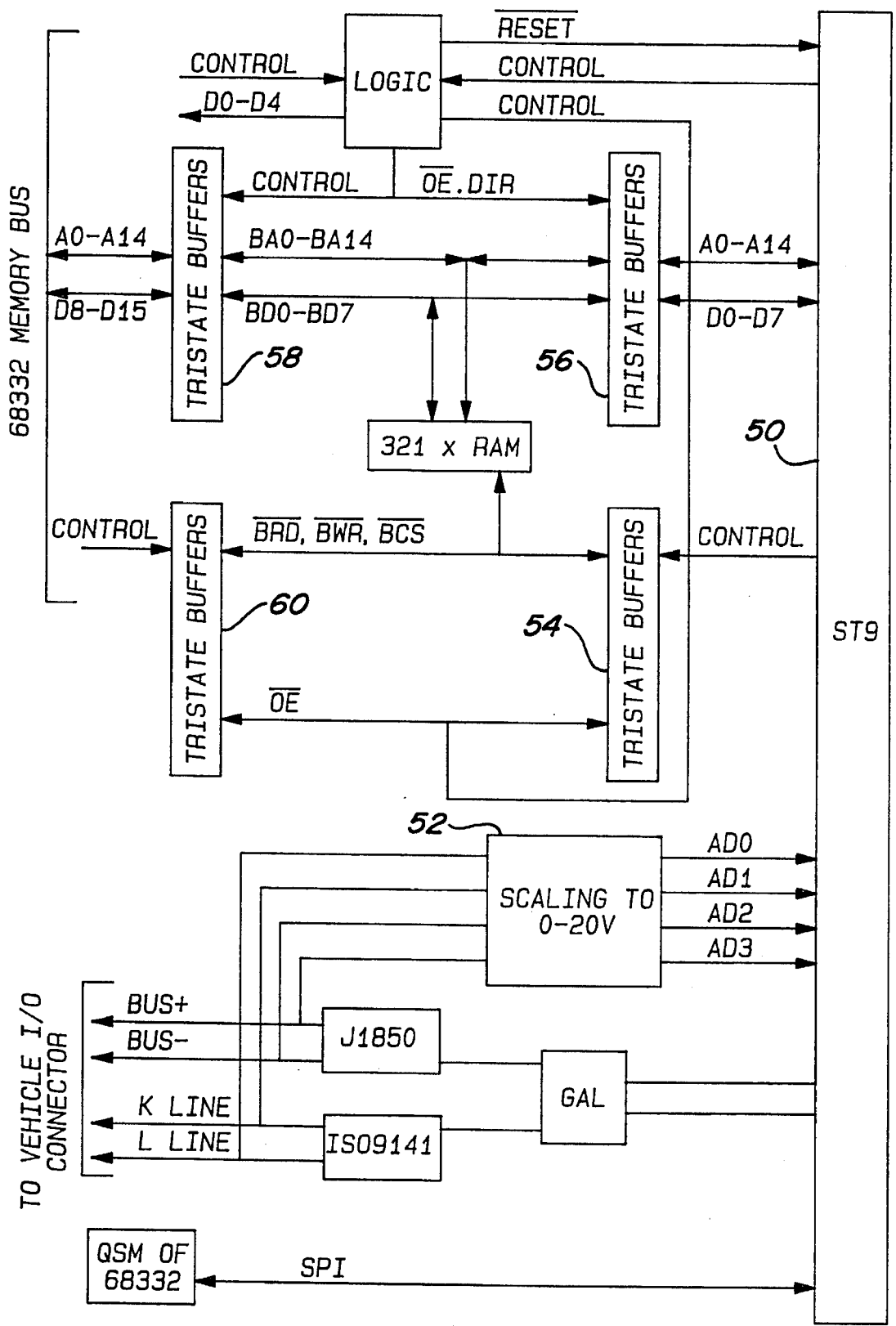
FIG. 4 is a block diagram representing the architecture of the hand held unit.

The actual architecture of the hand held unit's controller can be found in FIG. 4. As shown here, there are two microcomputers on board, an ST9 50 and an MC68332 (not shown). The ST9 microcomputer, commercially available from S. G. Thomson of Texas, is the communications coprocessor while the MC68332 microcontroller, available from Motorola of Illinois, performs the diagnostic and data gathering features. The ST9 controller has A-D converters 52 for measuring and scaling information from the vehicle interface connector, and has addressing and data control buffers 54-60 for communicating with the MC68332 controller. Likewise, the MC68332 has interface buffers and A-D converters. Here, both regular speed and high speed A-D converters are used to ensure the data gathering process is rapid and accurate. On board, the hand held unit has 4.5 megabytes of memory. One 250K block of memory is the boot ROM, which can be reprogrammed, or "flashed", to alter the operation of the hand held unit. The boot memory contains the operating system and device drivers used by the hand held unit. Another 250K block of memory is pseudostatic memory with a ninety-six hour storage life. This memory is used for storing specialized diagnostic routines that have been downloaded to the hand held unit, and for storing customized data gathering templates. Another 1 Mb block of memory is also flashable, and stores the diagnostic procedure information. This memory can be reflashed via the master station link 18 from the master station 14 or can be reflashed using a memory expansion card in one of the expansion slots 31, 48 or via the RS232 serial link 40. Another 1 Mb block of memory is pseudo static memory with an eight hour life. This memory, like the ninety six hour life memory, is used to store information such as specialized diagnostic routines. The final 2 Mb block of memory is RAM.

The master station connection port 44 supports GPIB communication protocol between the hand held tool 10 and the master station 14. When connected to the master station, the hand held tool can operate as the controller, talker or listener. When in the controller mode of operation, the hand held tool controls the operation of the master station and performs diagnostic routines by querying the vehicle controllers via the vehicle interface 42. In the talker mode, the hand held tool 10 communicates with the master station 14 by transmitting information to the master station. Similarly, in the listener mode, the hand held tool receives information from the master station via the interface 44. In this embodiment, there is no means for the master station to communicate directly with the vehicle. Rather, the master station downloads information to the hand held tool for running specialized diagnostic procedures, and receives monitored vehicle perimeter information from the hand held tool via the communication link.

Scan Tool Mode

As was discussed earlier, the hand held unit 10 is capable of functioning as a diagnostic scan tool. When in scan tool mode, the hand held unit communicates with the vehicle 12 via the communication cable 16. Depending upon the type of vehicle being diagnosed and the particular controller within the vehicle being queried, one of the six available cables, as discussed earlier, will be selected. For the purposed of this discussion, it will be assumed that the ISO 9141/CARB cable has been selected because information from a standard engine controller is desired. One end of the communication cable 16 is connected to the hand held unit 10, while the other end of the cable is connected to the vehicle 12 at the service connector interface, usually located underneath the hood or the dashboard. The hand held unit 10 measures the resistance of the cable 16 and determines that it is the ISO 9141/CARB cable, and configures its communication protocol accordingly. The hand held unit 10, once connected into the vehicle communication bus via the interface, sends commands to the engine controller and receives information back. These commands are executed by the service technician by entering information in the hand held tool via the key pad.

Figure 5:
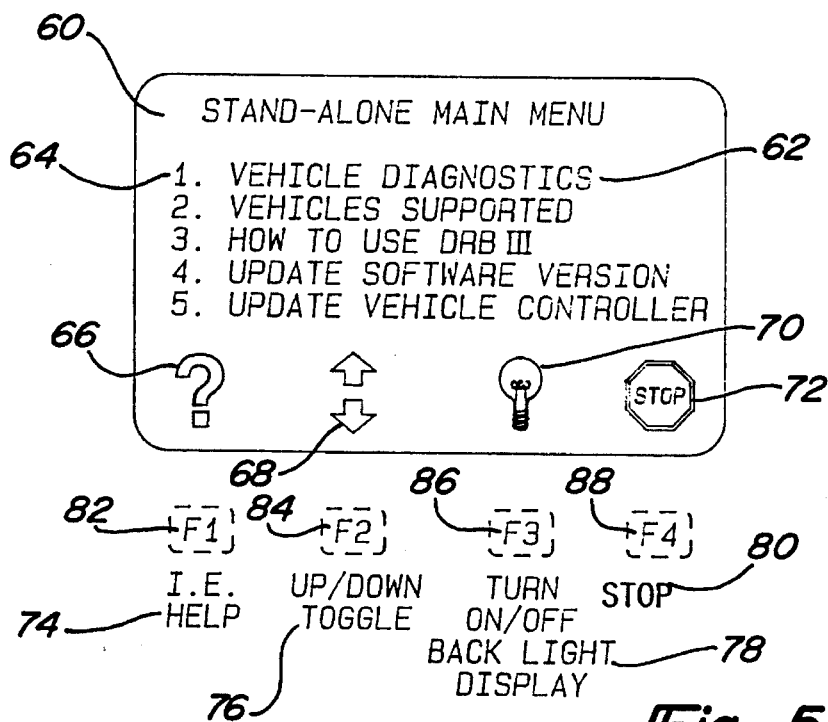
FIG. 5 is an illustration of the main menu of the hand held unit.

As shown in FIG. 5, upon powering up the hand held unit 10, the technician is presented with a menu display 60 providing a variety of options and function keys. In this initial screen configuration, the technician can select any menu item 62 by pressing the corresponding number 64 or can invoke a function such as "help" 66, "screen toggle" 68, "illuminate back light display" 76 and "stop" 72 by pressing the function F1 through F4 keys 74–80, respectively. It should be noted that providing the generic key face labels "F1" through "F4" 82–88 while providing the function describer in the form of an icon located above the key allows the key pad to be freely configurable through software. For example, since no action is being undertaken by the hand held unit when the initial menu is presented, the F4 key need not be assigned the function of "stop". Rather, at that stage, the key may be de-assigned, in which case no icon 66–72 would appear over it and no action would be taken in the event of that key being stroked, or the key may be reassigned, in which case a new action and associated icon can be designated. One of ordinary skill in the art can appreciate that the ability to assign, reassign and de-assign activities to the function keys allows the scan tool to be readily configured for use with a variety of vehicles and vehicle controllers without requiring physical modification of the unit. Moreover, the icons can serve a dual function of being both a key identifier and an activity indicator. In this embodiment, the "stop" key serves not only to identify that the F4 key will invoke the stop function, but also serves as an operation-in-progress indicator by blinking whenever an operation is running. If the technician invokes the stop function, the icon stops blinking to indicate the operation has been stopped.

Action taken based upon the actuation of a function key 26 is immediate; that is, there is no need to press the enter key 28 to execute a function key. In contrast, while the alphanumeric keys 29 are used to enter characters, the characters are not actually acted upon until the enter key 28 is pressed. For example, to select item number one, "vehicle diagnostics" 62, the user can depress the numeral one on the key pad to move the highlight curser bar to the first item. Similarly, the user could use the directional arrow keys 27 to scroll the highlight bar to item number one. Once the highlight bar is highlighting, or pointing to, the first item, the user depresses the enter key to indicate that the first item is the desired item to be acted upon. In this way, accidental key strokes do not result in unintended activity. In the event of an accidental key stroke, the key stroke can simply be overridden by later key strokes or the character typed over by backing the curser over the character and typing a new character.

Figure 6:
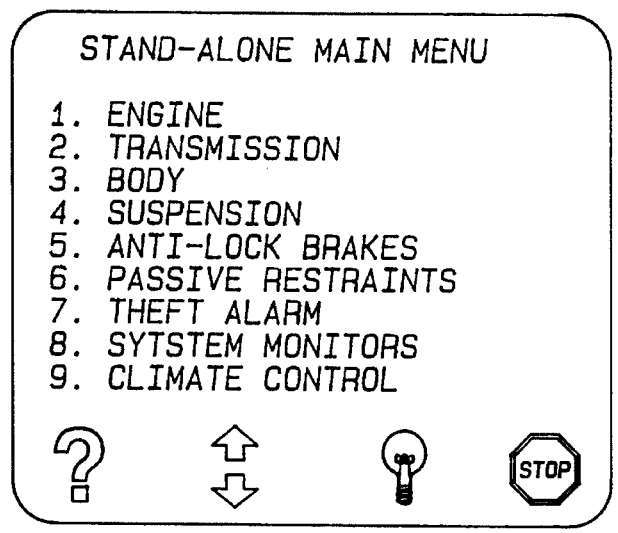
FIG. 6 is an illustration of the hand held unit screen when selecting a vehicle system for monitoring.

When in scan tool mode, the user can step the hand held unit 10 to accomplish different procedures. As shown in FIG. 5, once the user selects the vehicle diagnosis option, the next screen the user is presented with is the system selection screen, shown in FIG. 6. In this screen, the user can decide which controller is to be queried. Depending upon the system selected, the user is presented with a variety of options for querying the controller as to stored diagnostic codes and monitoring operational parameters. For example, most engine controller store codes in the event that an operational problem is detected. For the purposes of this discussion, the error code stored by the engine controller will be assumed to be an error code associated with an O2 sensor reading below the required threshold. Using the hand held unit, the technician can send commands to the engine controller to have the engine controller relay its fault code information to the hand held unit for display. In this instance, such a command would result in the display providing a reference such as "O2 sensor threshold low". Based upon the fault codes read, the technician can then decide how he would like to isolate the problem. If desired, he can connect the hand held unit to the master station to progress through a diagnostic routine, wherein the technician is stepped through a series of actions which help the technician identify and isolate the cause of the problem. In this instance, the fact that the O2 sensor reading is abnormally low does not necessarily mean that the O2 sensor is bad. Therefore, the diagnostic actions prescribed in the diagnostic steps would walk the technician through the fault diagnosis procedure to aid him in isolating the problem. The manner in which the hand held unit and the master station cooperate when running diagnostics will be described in greater detail later.

Digital Multi Meter Mode

Another important feature of the hand held unit is its ability to operate as a stand alone digital multi meter (DMM). In this embodiment, the hand held unit is provided with two sets of probe inputs 32–38 to allow measurements at two test points. Operation as a DMM can be invoked two different ways. First, the technician may be requested to perform an electrical reading as part of one of the diagnostic steps. For example, using the O2 sensor hypothetical, one of the diagnostic steps may require the technician to measure the resistance of the O2 sensor. By placing the probes at the appropriate point on the O2 sensor, the hand held unit will measure the resistance of the sensor and display that resistance reading on the screen. Thus, rather than requiring the technician to grab a separate ohm meter and perform the reading and input the measurement into the hand held unit, integrating the DMM mode into the scan tool mode allows the measured reading to serve as the technician's response to the scan tool's query.

Additionally, the technician can invoke DMM mode by simply pressing the DMM key on the key pad. Invoking DMM mode simply suspends whatever operation the scan tool is currently engaged in for being resumed at a later time. Specifically, a split window is opened on the display screen: the top half of the window shows the DMM mode, while the bottom half of the screen shows the suspended operation. The technician can toggle between DMM mode and the suspended operation by using the F2 "toggle up/down" key. When the technician toggles down to the operation window, the operation is resumed and the DMM mode is suspended. To completely exit from DMM mode, the technician simply depresses the DMM key again. Thus, the technician can be performing a diagnostic procedure on one vehicle and can interrupt that procedure to perform an electrical reading on a separate vehicle without requiring the technician to terminate the diagnostic procedure on the first vehicle. This feature further enhances the technician's ability to operate in an efficient manner.

Moreover, by providing two sets of probes, the technician can perform voltage differential tests quickly and easily. For example, to measure the voltage drop across an element using conventional means, the technician would be required to use two separate meters and perform two separate readings, subtracting one reading from the other to obtain the difference. By using the hand held tool in the DVOM mode, the technician can simply attach each set of probes across the element in question and the hand held unit displays the voltages on the screen.

A further feature of the DMM mode is that each set of probes can be operated independently of the other. That is, one set of probes can be used to measure current draw while the other set of probes can be used to measure voltage drop. Again, the technician's efficiency is greatly improved by this feature. Rather than requiring the technician to use separate meters to perform different types of readings, or requiring the technician to perform these different readings sequentially, the technician can simply attach the probes to the items in question and perform these different types of readings simultaneously.

A further feature of the DMM mode is that single probe measurements are possible. This feature is especially important when attempting to measure electrical characteristics of devices in hard to reach locations. Because the hand held unit can be connected into the vehicle communication bus via the communication link, the hand held unit is provided with system and chassis ground via the communication link, obviating the need to provide a separate measurement ground via the test probe. Therefore, using only one lead of the test probe, voltage and current measurements can be obtained, using the signal or chassis ground provided via the communication link as the measurement ground.

Controller Update Mode

The hand held unit is also capable of downloading information to the vehicle controllers for the purpose of updating these controllers. For example, most controllers utilize a combination of ROM and RAM. The ROM contains the control algorithm and calibration parameters, while the RAM contains operational parameters. When controllers were first being used on automobiles, the ROM was hard coded, that is, the ROM was fixed and unchangeable. Likewise, RAM was volatile and any information stored in RAM would be lost if the controller power supply was interrupted. Today, automotive controllers rely upon a combination of hard coded and erasable ROM in addition to RAM. The erasable ROM usually contains information such as calibration parameters. Frequently, after a vehicle has been introduced into production, knowledge learned after use of the vehicle by customers in the field will necessitate a change in calibration parameters. Rather than requiring the entire controller to be removed and replaced or the memory chips to be removed and replaced, storing calibration parameters in erasable ROM allows the calibration parameters to be rewritten. Here, the hand held unit has the capability to write, or "flash", erasable memory on the vehicle controllers. To accomplish this, the hand held unit has, stored in its own internal memory, the new information to be downloaded to the vehicle controller. The technician enters the flash programming mode by selecting the appropriate menu item from the display screen. Once this mode is selected, the hand held unit sends a control message to the controller to inquire as to the version and model number of the controller's memory. Upon receiving the response from the vehicle controller, the hand held unit determines whether or not the vehicle controller's memory needs to be updated. If the memory does need to be updated, the technician is presented with a screen indicating so and asking the technician whether or not he wishes to proceed. Assuming the technician has indicated his desire to proceed by pressing the yes key, the hand held unit sends the commands to the vehicle controller necessary to reconfigure the programmable ROM to reflect the new calibration values. The process of sending the appropriate commands and calibration data to a vehicle controller and verifying that the information has been correctly received and stored is well within the grasp of one of ordinary skill in the art, and therefore will not be described in detail herein. Once the commanding, writing and verification process has been completed, the hand held unit displays to the technician whether or not the vehicle controller update procedure has been successful.

Service History Recording Mode

The hand held unit is also capable of recording service history information on the vehicle controllers. Similar to the process of updating calibration information, the hand held unit can send commands to the vehicle controller to store information regarding service procedures. For example, when in the scan tool mode, the technician is reading fault code information from the vehicle controller in an attempt to diagnose and isolate the cause of the fault condition. Once the technician has successfully isolated and remedied the problem, the service history recording mode of the hand held unit allows the technician to erase the fault code from the vehicle controller's memory and store codes indicating what procedures were performed and when. Such information proves very useful during later diagnostic procedures when attempting to isolate new fault conditions, because actions taken by service personnel during previous service visits often affect the manner in which new problems are diagnosed. For example, through the service history recording mode, the technician could indicate that, using the hypothetical O2 sensor situation, the low O2 sensor reading problem was cured by reseating the O2 sensor connector. In the event the vehicle is brought in for service at some later date once again exhibiting a faulty O2 sensor reading, the stored service history information can be used during a diagnosis procedure to direct the technician to check the connection to see if the connector simply needs to be replaced. As such, one of ordinary skill in the art can appreciate how the storing of service history information in the vehicle controller's memory would be valuable, and that the type of information stored can be customized to suit the specific needs of the situation.

Customized Templates

From the foregoing discussion, it can be appreciated that the hand held unit can monitor hundreds of different parameters on the vehicle. For example, the engine controller can provide information regarding fuel-air ratio, the transmission controller can provide transmission oil temperature, the anti-lock brake controller can provide wheel speeds and the body controller can provide information on whether lamps are burned out or doors are opened. Thus, it is possible for the hand held tool to gather, from a variety of sources, information necessary to diagnose problems. Moreover, there may be instances when the service technician desires to monitor information from these various sources simultaneously during service and maintenance routines. Therefore, the hand held unit has been provided with the capability for the technician to develop customized reading templates for gathering such diverse information quickly and efficiently. To develop a customized template, the technician simply selects the menu item for using and storing templates. By selecting this item, the hand held unit is placed in a programming mode of sorts.

The technician can retrieve predefined templates from memory and can store and retrieve customized templates as well. To retrieve a predetermined template, the technician simply selects that template from the selection list. For example, such a predetermined template may provide information as to whether or not the brake pedal is depressed and whether or not the brake lamps are illuminated for the purpose of diagnosing wiring or lamp failures. While such a predetermined template is usually retrieved automatically during the process of performing a diagnostic routine in the scan tool mode, the technician can selectively retrieve predetermined templates for use outside of the scan tool mode.

It can also be appreciated that the technician may find a need to define his own customized templates. To do this, the technician enters the customization mode and simply selects from lists those parameters he wishes to display in this customized template. After selecting the items and building the template, the technician can store this customized template in the memory of the hand held unit by selecting the store option and entering an appropriate template identifier string. For example, the technician may simply want to store the template by identifying it as "CUSTOM 1", or may wish to identify the template by his name, the date, or other such unique identifiers. To enter characters for the template identifier string, the technician simply presses the shift key while simultaneously pressing one of the alphanumeric keys to access letters rather than numerals. For example, to enter the first character of "CUSTOM 1", "C", the technician would hold the shift key down while depressing the 1/ABC key three times: the first time he pressed the key the letter A would appear, the second time the letter B would appear, and the third time the letter C would appear. In the event that the technician presses the key too many times, the character sequence simply restarts. Therefore, upon the forth time, the letter A would again reappear. To enter the next character, the letter U, the technician would depress the right arrow key to parse over to the next character position and would depress the shift key while simultaneously depressing the 7/STU key three times. Once the identifier string has been built, the technician can enter that name by simply depressing the enter key.

The hand held tool stores the customized template in the ninety-six hour memory according to the identifier string. Alternatively, the technician can direct the hand held unit to store the template on a memory cartridge, or can upload the template to the master station for storage on its internal hard drive or on a floppy disk. During later operations, the technician can retrieve this customized template by selecting it from the list of available templates.

Data Logger

Another important feature of the hand held unit is its ability to function as a data logger. Often, when conducting diagnostic procedures, the technician will be unable to recreate in the garage the problem of which the customer is complaining. Rather, many problems often manifest themselves as the car is driving over bumps or underneath power lines—conditions which cannot be recreated in a garage. Therefore, the technician can use the hand held tool to monitor vehicle parameters as the vehicle is being driven. By monitoring vehicle parameters on a real time basis, the technician can obtain a better understanding of the conditions which may be causing the problem.

To operate the hand held unit as a data logger, the technician selects the data logging option from the menu. With the hand held unit connected to the car via the communication ink, all of the parameters which were available for measurement during measurement and testing procedures are also available for logging. Therefore, the technician can select a predefined data logger template or can establish his own customized template in a manner similar to that which was previously described. The template defines which variables are to be monitored. Depending upon the number of variables to be monitored, the hand held unit's internal memory samples these parameters and stores them for later retrieval. In this embodiment, since the hand held unit's memory is limited, the logged data is stored in memory using a shift register concept. That is, as new data is logged, older data is overwritten. Therefore, in the hand held unit's memory, the logging information stored represents a snapshot, or window, of information.

As the technician drives the car around and the hand held unit logs data, the technician can que the hand held unit to "freeze" a window of information. This is accomplished by the technician triggering the read-hold key on the keypad. When the trigger is activated, the hand held unit stores a window of information in memory such that the values of the monitored parameters around the time of the trigger are stored. In this way, the hand held unit stores the parameters so that the behavior of the monitored parameters before, during and after the trigger can be retrieved for later inquiry. Such information often proves valuable when diagnosing problems which manifest themselves only while the vehicle is being driven.

Expansion Modules

As was initially discussed, the hand held unit has expansion ports for receiving expansion modules. These modules can take a variety of forms, and can include not only additional memory but interface circuitry for allowing the hand held unit to communicate with different devices. Providing for the expansion ports and expansion module capabilities allows the hand held unit to "grow" as technology evolves without requiring the entire scan tool to be traded in or reconfigured. Also, new features can be incorporated into the service tool system more economically, because only the circuitry for the new feature need be designed—the hand held unit itself does not require rebuilding or redesign. For example, an expansion module for performing radio frequency measurements may become available. The expansion module would contain the circuitry needed to perform such a specialized measurement and would interface to the hand held unit via the expansion port. To allow the hand held unit's controller to control the expansion port and interpret the measured information, operating routines can be downloaded into temporary memory or the memory of the hand held unit could be reconfigured (as will be described in greater detail in the "service tool update" section) to provide the instruction sets necessary to execute such features.

Other Features of the Hand Held Unit

Figure 7:
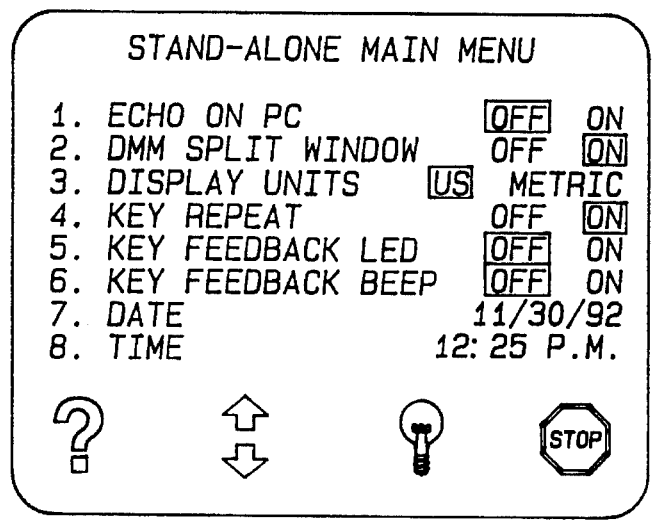
FIG. 7 is an illustration of the hand held unit screen when setting user options.

As shown in FIG. 7, the technician can also customize the manner in which information is presented to him. For example, he can change the display units from U.S. to metric and can change the date and time. As before, items from the menu are selected using the alphanumeric and/or arrow keys. Also, the hand held unit has on-board help procedures to aid the technician in the use of the hand held unit. Help can be invoked one of two ways: first, by selecting the "how to use" unit item from the main menu as shown in FIG. 5, or by pressing the "help" key at any time during operations. Invoking help by pressing the "help" key during operations presents the technician with context-sensitive help information. For example, if the technician is using the hand held unit in DVOM mode, invoking help will provide the technician with help screens related to DVOM mode. Moreover, from within help, the technician can view help topics related to any aspect of the hand held unit, by simply paging forward and backward and selecting new help topics.

Using the RS-232 connection, the hand held unit can be connected to other devices such as a modem or a printer.

Master Station

The master station 14 is designed to work in cooperation with the hand held unit in performing sophisticated diagnostic procedures and the like, and can operate independently of the hand held unit as a reference resource for the service technician. The master station itself is approximately 4½ feet tall, with a base dimension of approximately 36 inches by 24 inches. The heart of the master station is an IBM-compatible computer with an internal hard drive. The master station also includes a 19 inch monochrome video monitor 100 for graphics display, a keyboard 102, a floppy disk drive and CD-ROM drives 104, and communication cables 18. The master station cart 106 has casters 108 at the base for allowing the station to be rolled from place to place. The internal memory of the computer contains the master station operating system, while the CD-ROM drives are used to store service and diagnostic information and the like. The floppy disk drive accepts standard 3½ inch disks and is used for things such as swapping information between stations and for performing backups and storing seldom used information, while the larger capacity hard drive is used for storing information such as diagnostic results and customized test procedures. The master station can operate alone or in conjunction with the hand held unit 10. Specifically, regardless of whether the master station 14 is connected to the hand held unit, the master station is capable of operating as a technical information library, parts catalog and host update link. However, when connected to the hand held unit, the master station is also capable of acting as a data recorder, diagnostic station, and hand held unit update host. The master station, besides having a GPIB interface for communicating with the hand held unit, also has an RS-232 interface for communicating with other service tools. In this embodiment, earlier generation hand held units communicated only via RS-232. Therefore, the master station of the present invention can communicate with older units via the RS-232 while also communicating with the hand held unit via the GPIB link.

Regardless of the mode of the master station, the user interface appears similar to that of FIG. 8. As can be seen, the user interface is both graphic and textural in nature, where the highlight bar can be moved between items to select the desired action. To move the highlight bar, the technician can use the keys of the keyboard or, if the hand held unit is connected to the master station, can use the key pad on the hand held unit. Similar to selecting items on the hand held unit, the technician can parse through screens using directional arrow and paging keys. Also, as was the case with the hand held unit, the technician can "backup" through procedures in the event he changes his mind about the course of the action selected.

Technical Information Library

The master station obviates the need for printed paper manuals and service bulletins through its technical information library mode. In this mode, the technician can access service manuals and service bulletins, which are stored on the CD-ROM's, for display on the monitor. This mode has several benefits. First is the advantage of obviating the need for paper manuals and service bulletins, which often become torn, soiled and lost over time. Also, because the information is stored electronically and retrieved only as needed, there is no need to have book shelves for storing these items. Moreover, as information changes and requires updates, new "pages" can be added electronically by updating the CD-ROM without requiring the technician to physically insert pages into a printed manual. Updating technical information can also be accomplished by supplementing the information on the CD-ROM's through information stored on floppy disks, as well as information available via telecommunication download links, such as modems. In this embodiment, the master station can be connected to any conventional phone line for communicating with a remote host computer for downloading update information. Once the information is downloaded into the master station, the updated information can be stored in the internal memory of the master station or on a floppy disk. By allowing updated information to be provided via these different methods, the master station technical information library can be easily maintained in an up to date state.

Another advantage of the master station technical information library is that, because the information is stored electronically, it can be sorted and filtered before being presented to the technician. That is, the technician can indicate that he is looking for information related to a certain vehicle or a certain component, and the master station can retrieve those portions of the technical information library relevant to the technician's query, without requiring the technician to leaf through otherwise irrelevant information. This has a great advantage to printed media, since the technician must physically parse through the pages to find the relevant information when using printed manuals. The technician can also search for information by the vehicle information number (VIN) in a similar matter.

As part of the technical information library, the master station also includes an on-line parts catalog. Using this feature, the technician can view various components of the automobile, and can place orders for parts that the service station may not carry in stock. When connected into a common phone line, the master station can automatically place orders for these parts using an electronic ordering system.

Diagnostics Mode

Figure 9:
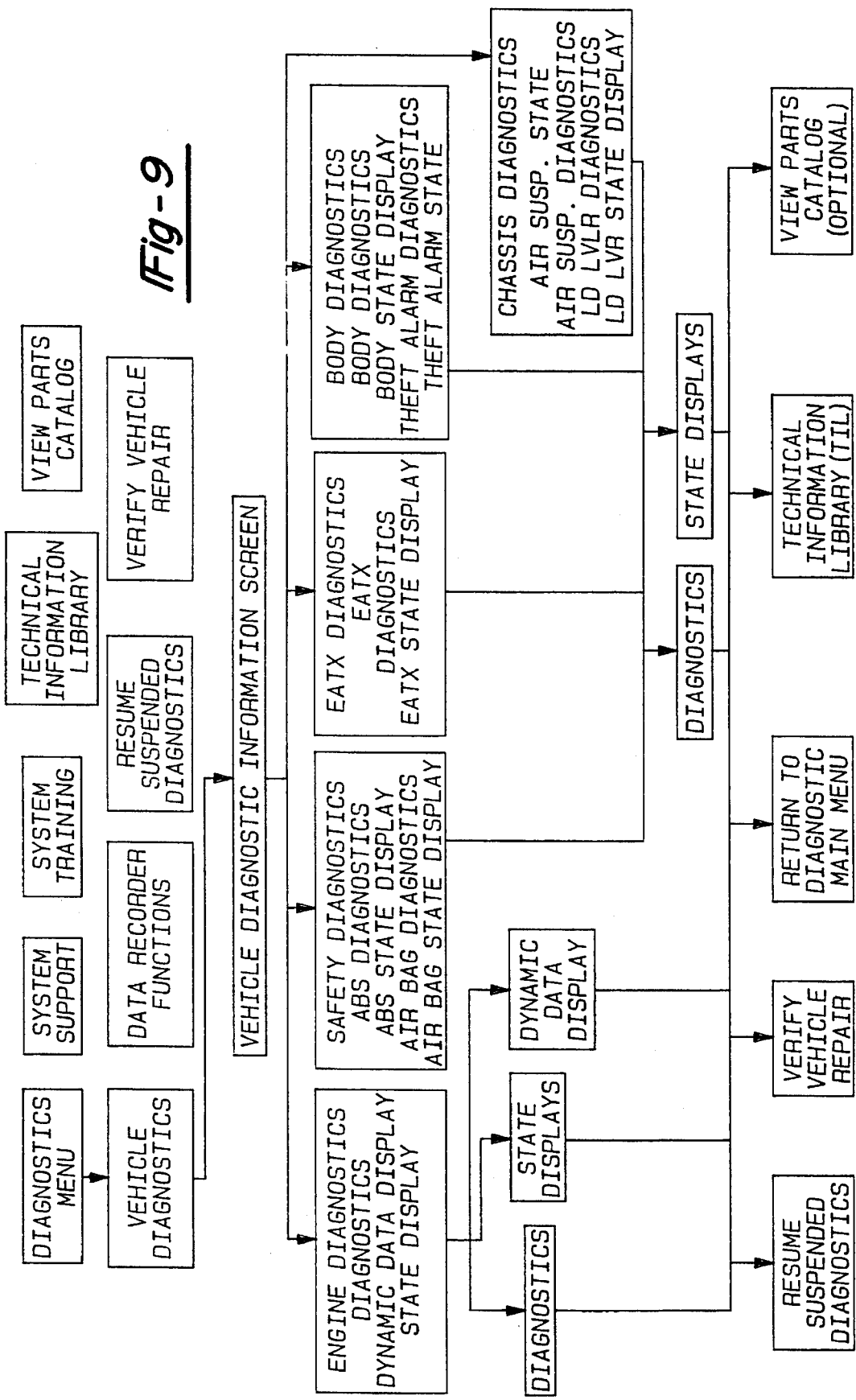
FIG. 9 is a logic tree showing various features available.

When connected to the hand held unit, the master station augments the hand held unit's diagnostic capabilities. These features are represented as a logic tree in FIG. 9. Because the hand held unit, by its nature, has only a limited amount of memory available, the master station is used to store all diagnostic procedures for all the various controllers and vehicles which are supported by the service station or dealership. As the technician performs a diagnostic procedure on the vehicle, the hand held unit will request the master station to send it additional diagnostic information in the event the hand held unit's memory does not contain the required diagnostic procedures. This information is then downloaded to the hand held unit via the communication link 18 and stored in the eight hour memory.

It can be appreciated that the information downloaded from the master station to the hand held unit requires a substantial amount of memory. Here, because there is a limited amount of memory available for storing these downloaded routines, the hand held unit purges from its memory those routines and information used the least in favor of storing the newly downloaded information. This scheme is often referred to as a "least recently used" memory management scheme, and allows information which is rarely used or which have never been used to be removed from memory, rather than a "first in, first out" scheme which automatically removes the longest stored, or oldest, information from memory simply because it has been there longer.

Figure 10:
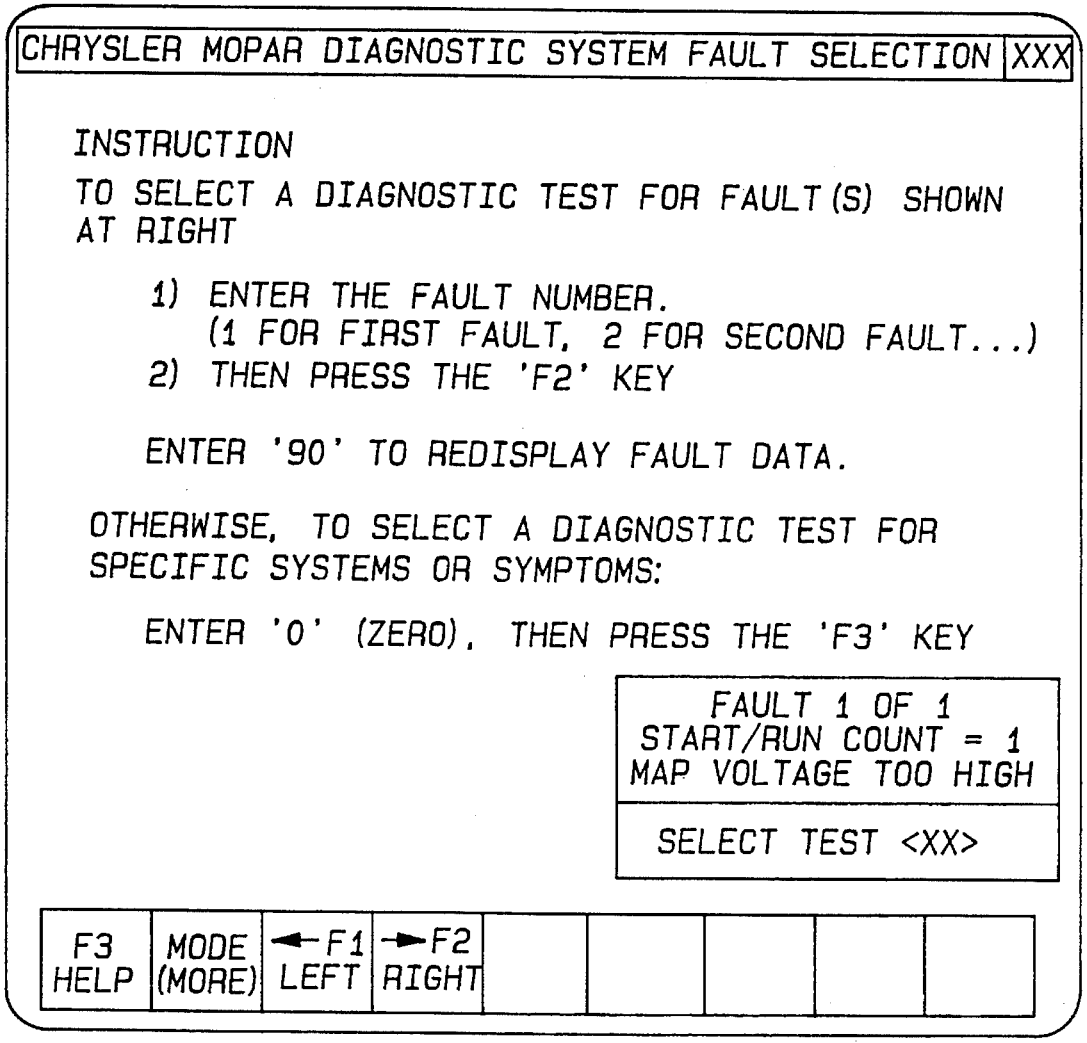
FIG. 10 is a sample diagnostic instruction screen from the master station.

When in diagnostic mode, it is important to realize that the hand held unit and master station operate synchronously; that is, as the technician steps through the diagnostic procedures, the hand held unit and master station step through the procedure together. In this way, the technician can either use the key pad on the hand held unit or the keyboard of the master station to step through the diagnostic procedure. More importantly, however, because they are stepping through the procedures together, the display of the master station displays the graphical and textural reference from the technical information library which corresponds to the diagnostic step being performed. For example, as shown in FIGS. 10 and 11, the master station display informs the technician of the action required for the particular diagnostic step, while presenting a graphic representation of the vehicle or systems in question. Thus, where the technician may have previously relied upon a printed manual for a graphic representation of the components he must locate, the master station displays these graphical representations in conjunction with the instruction text for each of the diagnostic steps. To appreciate this feature, it should be realized that the technician still could performs diagnostic tests without linking the hand held unit to the master station. If he chose to operate in this manner, he would refer to a printed service manual, or would invoke diagnostic mode on the master station without linking the hand held unit, and he would manually page through the diagnostic procedure step by step. Thus, the technician would have to refer to the diagnostic procedure for the required action, and would then use the hand held unit to gather measurements required for that particular step. Once he completed that step, he would flip to the next step and perform the required action. Here, by linking the master station and hand held unit together and by having them step through the diagnostic procedure synchronously, the technician is relieved of having to manually parse through the test procedure.

Also, another important feature of the system is that, when in diagnostic mode, the master station displays test results, just as the hand held unit would display test results, based upon the diagnostic procedure being performed. The hand held unit actually controls the progress of the diagnostic routine. Any entries on the key pad are sent from the hand held unit to the master station and back from the master station to the key pad as a synchronizing handshake. Any entries on the keyboard of the master station are sent from the master station to the hand held unit, which actually acts upon the command.

The diagnostic routines are actually tokenized routines which are interpreted by the hand held unit's MC-68332 interpreter. This is in contrast to diagnostic routines of other commercially available systems, which are actually coded programs. Here, new diagnostic routines can be "written", or built, using a flow chart form of representation. Specifically, any common computer can be used to built the diagnostic routine as a series of action blocks linked by logic flow paths. These routines are then compiled by the master station as tokenized routines, which are downloaded to the hand held unit for interpretation and execution. Thus, the support personnel writing diagnostic procedures need not be sophisticated programmers; rather, the support personnel simply need to be able to visually describe what steps are to be taken and in what order, since the master station and hand held unit are designed to use these forms of routines. Thus, each diagnostic routine can be thought of simply as a series of steps, where the preceding step leads to the following step. Where there is a choice of steps, the preceding step simply leads to one of the alternative step based upon the technician's choice of action.

In the course of running a diagnostic routine, the technician is required to perform certain tasks, such as checking to see if a connection is secure or performing a voltage reading. After taking the required action, the technician can respond to queries from the system by entering "yes" or "no", or by entering numeric or alphabetic information via the keypad. For example, in diagnosing the hypothetical O2 sensor problem, the system may require the technician to first check to see of the connection is secure. Once he has checked the connection, the technician responds to the system by pressing the yes or no key accordingly. Similarly, the system may require the technician to measure the resistance of the O2 sensor. By placing the probes of the hand held unit on the O2 sensor connection points, the hand held unit measures the resistance and displays the reading. The technician can then indicate the reading appears to be accurate by pressing the yes or no key.

The various diagnostic steps can be though of as "pages", where paging down involves moving on to the next step, and paging back involves back tracking to the previous step in the sequence. The technician can control his progress through the diagnostic steps by using the page up and page down keys. By allowing the technician to freely parse through the diagnostic steps, the hand held unit provides greater flexibility for the technician in diagnosing the problem. For example, after progressing through the diagnostic steps for a while, the technician may determine that he is proceeding down a less than fruitful course of action. In such an instance, the technician can use the page up key to back track through the diagnostic procedures. This allows the technician to back track, for example, and modify his response to previous queries or select a different course of action when he was presented with several choices. Thus, using the previous example of a low O2 sensor threshold reading, if the technician originally responded to the question of whether or not the connector was secure by pressing the "yes" key but he later determines that the connector, while appearing to be secure, was actually loose, the technician can back track through the diagnostic steps to that screen and modify his answer to no. The ability to back track and modify selections is made possible by the way the diagnostic routines are built and stored as tokenized modules rather than conventional sequentially processed routines or programs. As one or ordinary skill in the art can appreciate, allowing such back tracking without requiring the entire diagnostic procedure to be re-initiated greatly improves the efficiency with which the technician can diagnose and isolate problems. One of ordinary skill in the art can also appreciate that, depending upon the vehicle controller being monitored and the type of problem which is being diagnosed, the diagnostic procedures presented to the technician will vary accordingly.

Data Recorder And Display Mode

Figure 12:
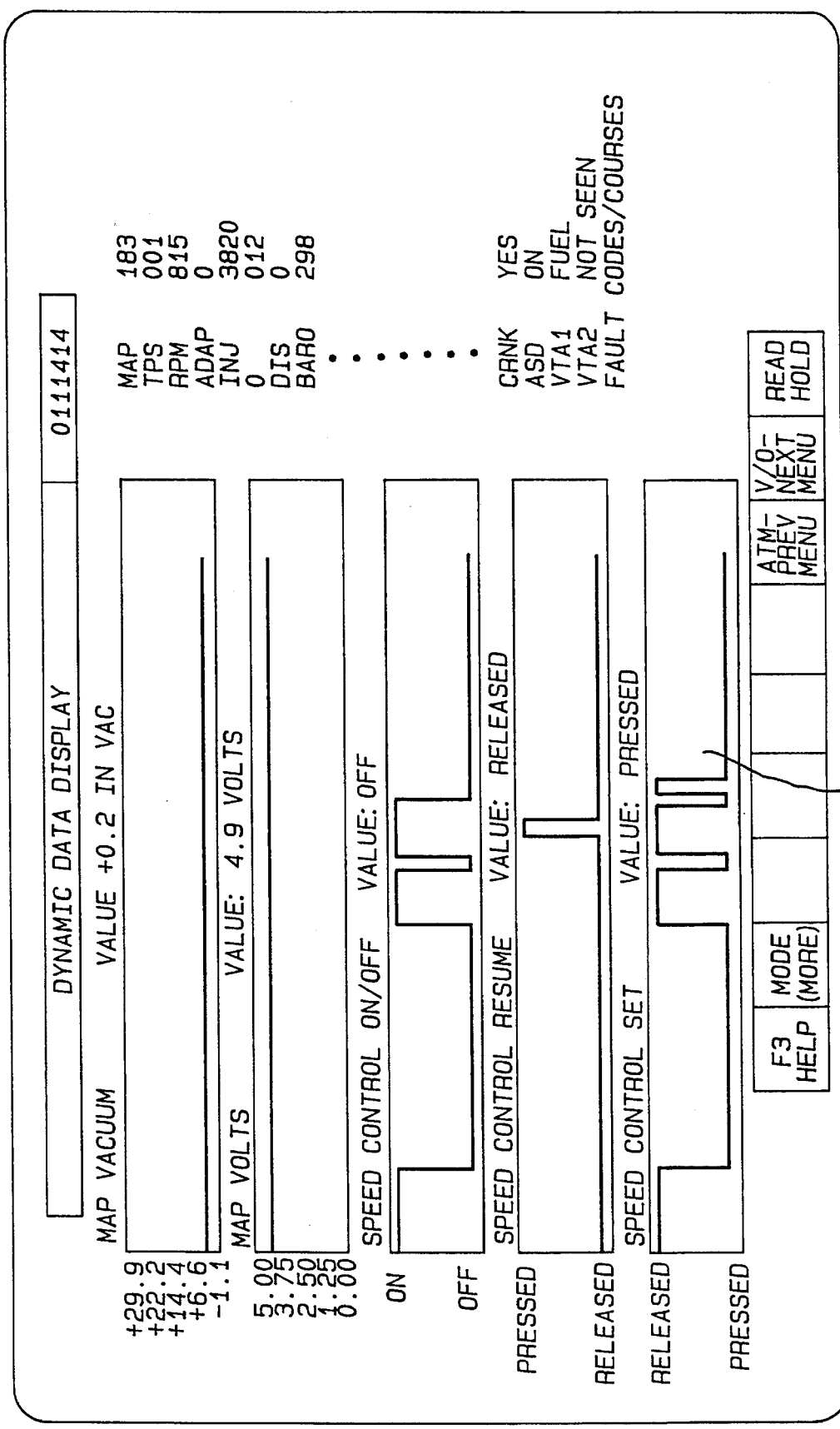
FIG. 12 is an illustration of the master station screen when displaying logged data.

When used in conjunction with the hand held unit, the master station can serve as a data recorder and display unit. As was discussed earlier, the hand held unit can serve as a stand alone data logger for capturing vehicle information as a vehicle is being driven. To display this information, the hand held unit is connected to the master station and the display stored data option is selected. As shown in FIG. 12, the captured data is displayed graphically as well as numerically. Moreover, in the event that many parameters have been monitored, certain of the parameters can be displayed graphically while the remainder of the parameters are displayed textually. Similar to the concept of using templates for selecting the data to be logged, the master station has templates that define which variables are displayed graphically as charts and which variables are displayed simply textually as numbers or as logic states. Again, the technician can retrieve predetermined templates or can define customized templates of his own. Since the data displayed represents a snapshot in time, the display cursor, represented as a dashed line 120 on the data graphs, indicates the point in time for which the variables are being displayed. Thus, the variables being displayed textually represent the value of those variables corresponding to the point in time where the cursor lies. The cursor position is represented as a relative time value from the beginning of the window, and is useful when attempting to determine the elapsed time between events or occurrences. It can be appreciated that providing data logging and displaying capabilities with the hand held unit and master station allows the technician to gather a wealth of information without having to rely upon additional, costly test equipment.

Figure 13:
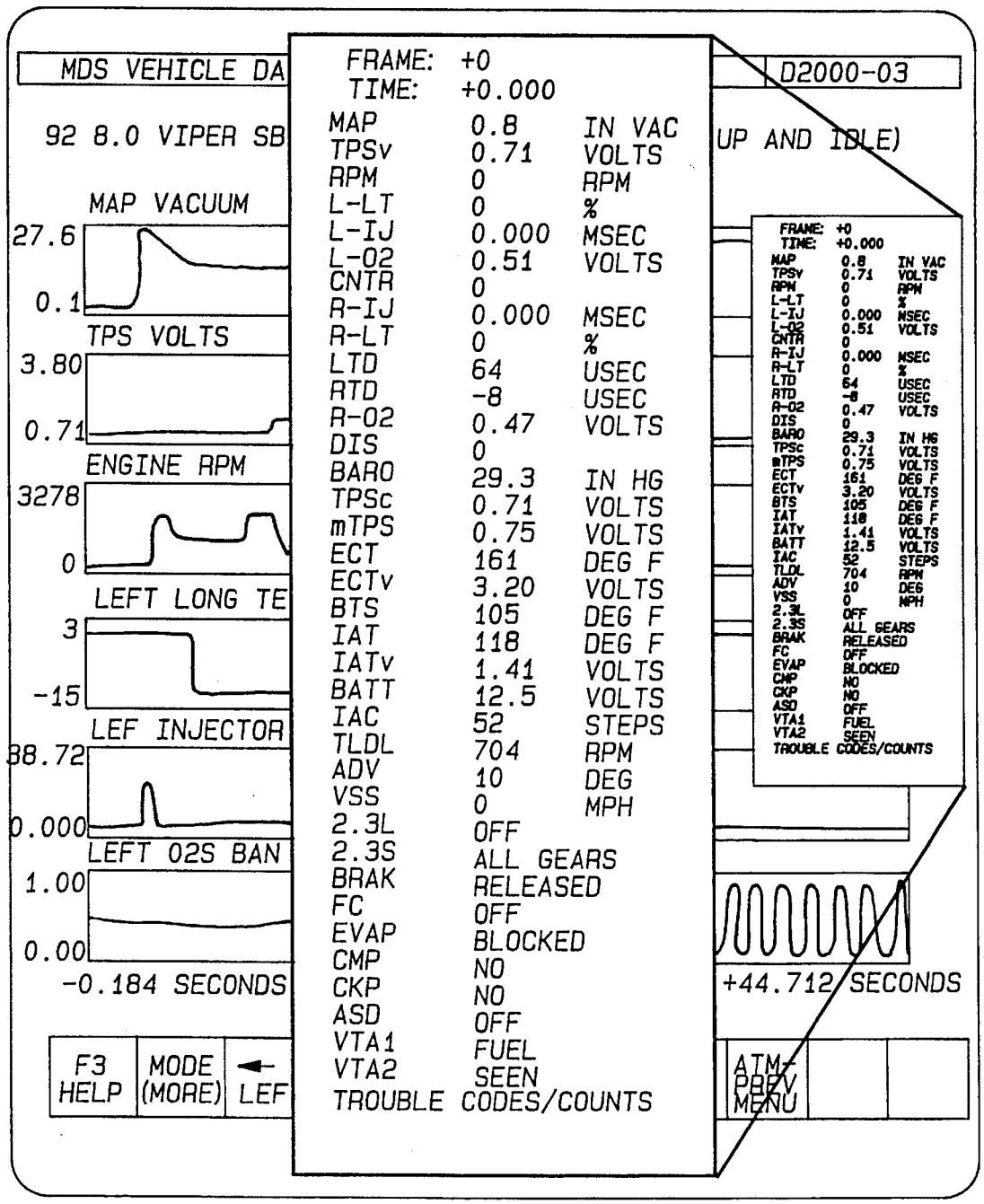
FIG. 13 is an detailed illustration of the textual data display when dynamically displaying parameters on the master station.

Besides charting previously logged information, the hand held unit and master station cooperate so that operating parameters can be displayed dynamically. As was the case before, the master station displays some of the variables as charts and other of the variables textually, depending upon the template selected. In the dynamic data display mode, many more parameters can be monitored than would be possible using the data logger alone as shown in FIG. 13. That is because the variables are being displayed dynamically, rather than being stored, and the amount of information gathered need not be limited by the amount of on board memory available in the hand held unit. However, if desired, the dynamically displayed data can be logged in the master station and stored in the master station's internal memory or on a floppy disk for later reference. Likewise, the master station has capabilities for creating customized templates which can be stored using string identifiers and retrieved for later use.

Scan Tool Update Mode

Besides being able to dynamically download information to the scan tool for use in diagnostic procedures, the master station can also reprogram the hand held unit in a manner similar to the way the hand held unit can reprogram controllers on the vehicle. When the hand held unit is connected to the master station, the technician can select the update scan tool option from the menu. Once in this mode, the hand held unit's memory can be reconfigured accordingly. Using this mode, not only can the basic diagnostic procedure stored in the hand held unit be updated, but the actual boot memory of the hand held unit can be modified as well. Thus, using the scan tool update mode, the basic operation of the hand held unit can be reconfigured as needed. This allows the hand held unit to be updated quickly and easily as needed, without requiring the technician to trade in scan tools or physically modify its configuration. The hand held unit can also be reconfigured without the master station by connecting it to a programming device via the RS-232 connection. Selective memory updates can be accomplished by employing memory cards used in the expansion slots.

Overview

A brief overview of how a technician would utilize all of these features and functions will now be provided. For the purposes of this discussion it will be assumed that the technician has been presented with a customer complaint that the engine sometimes hesitates when accelerating from a full stop. Based upon this information alone, the technician cannot readily diagnose the problem. Therefore, the technician connects the hand held unit to the vehicle so that he may retrieve information from the engine controller. The technician selects the appropriate cable, and the hand held unit identifies the cable and modifies its communication protocol accordingly. The technician selects the vehicle diagnosis option from the main menu and selects engine controller from the sub-menu. The hand held tool queries the engine controller and informs the technician that there is a fault code for lean air fuel ratio. The technician then begins checking the various sub-components on the engine to locate the cause of the fault. During the course of his diagnosis procedure, the technician uses the hand held unit to measure the resistance of the MAP sensor. The technician inserts the voltage probes into the hand held unit and places the other end of the probes across the MAP sensor. The resistance of the MAP sensor is read and displayed for the technician and the fault diagnosis procedure continues.

While the technician is diagnosing the problems on the customer's vehicle, the service manager interrupts the technician and ask the him to perform a voltage reading across an old car battery which has been in storage. Without having to disconnect the hand held unit from the car, the technician selects the DVOM mode on the hand held unit and measures the voltage across the battery as requested. The hand held unit displays the voltage reading for the technician. Once the technician is done with his side task, he simply presses the key pad to resume the fault diagnosis procedure.

After having proceeded through the fault diagnosis procedure without yet locating the problem, the technician turns to the master station to access the technician information library for more assistance. Using the keyboard on the master station, the technician enters the vehicle type and model year to see if a service bulletin has been issued regarding this problem. The master station searches its CD-ROM data base for a relevant bulletin and presents the information to the technician on the monitor. In this example, the bulletin informs the technician that problems such as this have indeed been experienced in the field, and a new diagnostic procedure has been provided. Upon learning this, the technician connects the hand held unit to the master station via the communication link and, using the keyboard, request the master station to download the new diagnostic procedure to the hand held unit. The master station relays the information to the hand held unit, and the new diagnostic procedure is stored in the hand held unit's eight hour memory. The technician then begins executing the new diagnostic procedure.

Since the master station is connected to the hand held unit while the technician is executing the diagnostic procedure, the master station displays for the technician information such as the particular step required and the appearance of the components in question. As part of the diagnostic procedure, the technician is requested to turn on the engine and idle it at 2,300 rpm. The master station recalls a predetermined template for displaying the dynamic data. The technician enters the vehicle and starts the engine, monitoring the engine rpm as displayed on the master station monitor. The master station monitor displays not only the engine rpm as a number along the right hand column, but also displays rpm, MAP sensor voltage, fuel rate, and throttle position as charts.

Figure 14:
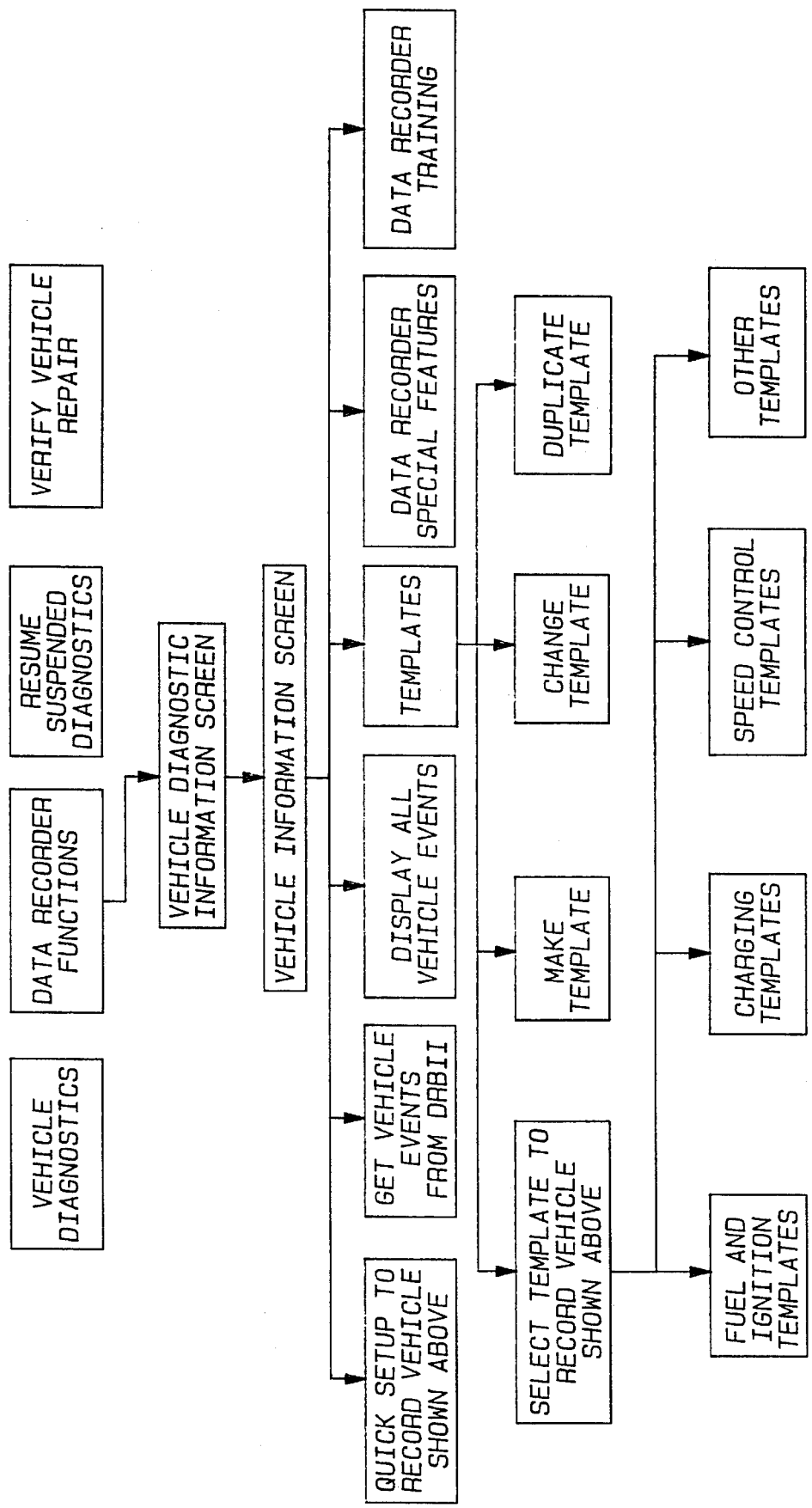
FIG. 14 is logic tree showing the data recording and logging functions.
Figure 15:
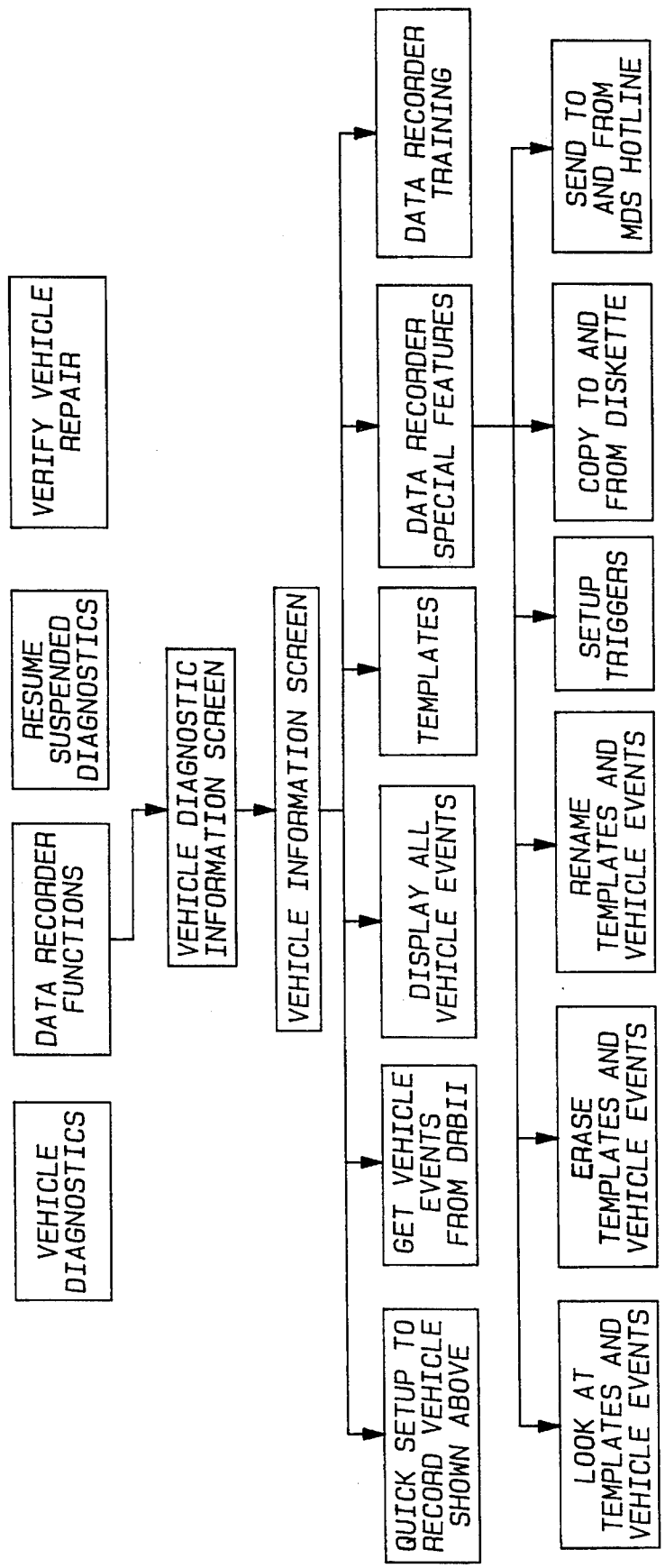
FIG. 15 is a logic tree showing how templates are stored and retrieved.

Unfortunately, this information shows the car is operating just fine, and fails to give him a clue as to the cause of the problem. So, the technician decides to suspend diagnostics and use the dynamic data display to check some things on his own. The technician selects the data display feature from the menu. FIG. 14 is a logic tree which shows the organization of the menu selection process used by the technician. He then looks through the predefined templates to see if there is one that suits his needs. Finding there is not a template to his liking, the technician selects the menu screen for building templates, as shown logically in FIG. 15. Once in the template building screen, the technician moves the highlight bar from item to item, selecting those he wishes to display during the dynamic data display operation. As shown in FIG. 16, the technician has selected some very specialized parameters such as cam shaft position and crankshaft position, because he thinks there is a problem with the timing belt alignment. While running the engine, the dynamic data display on the master station presents the monitored parameters to the technician as a combination of graphs and numbers.

Unable to diagnose the problem by simply running the engine in the garage, the technician decides to use the data logger as he drives the car around the service station's parking lot. The technician disconnects the hand held unit from the master station but leaves it connected to the car as he drives the car around. Bringing the car to a stop and beginning to accelerate, the car goes over a bump and the technician experiences a loss of engine power. At that moment, the technician presses the "read hold" key on the hand held unit's keypad to store this window of information. He drives the car back to the garage, disconnects the hand held unit and walks over to the master station, which has been since rolled to the other side of the garage by another technician. Reconnecting the hand held unit to the master station, the operational parameters are displayed on the monitor for viewing. At this point, the information provided to the technician allows him to diagnose the fault: fuel flow rate dropped to zero when the lag was experienced, and the fuel pump voltage dropped below the minimum threshold a few seconds prior to the fuel lag. Checking the connector to the fuel pump, the technician finds that the power lead has become corroded and needs to be cleaned. He cleans the connection and reseats the connector.

Figure 18:
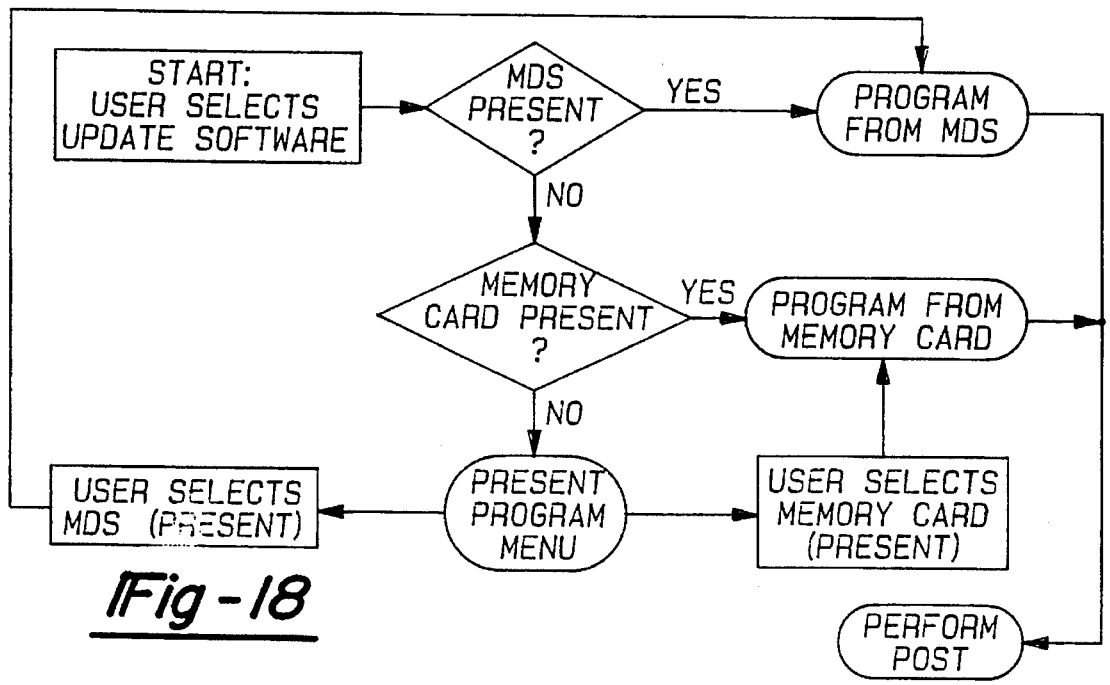
FIG. 18 is a function diagram illustrating the different ways the hand held unit can be updated.

Having successfully diagnose the problem, the technician then updates the engine computer to erase the fuel error air fault flag and enter the service information. He reconnects the hand held unit to the vehicle, and clears the codes. Next, as shown in FIG. 17, he enters his ID number, the VIN number, the service order number and the mileage in hand held unit and flash programs the information into the engine controller's service log memory. Before letting the car be released to the customer, the technician checks to see if there are any service bulletins indicating an interim calibration update has been released. Checking the technical library, he learns that there has been a new set of anti-lock calibrations released. The technician places a memory module with the new calibrations into the expansion slot of the hand held unit. As shown in FIG. 18, the technician can load update calibrations into the hand held unit using a memory card or the master station. Next, the technician queries the car's antilock controller to see if it has the latest set of calibrations. The controller responds that it currently it running "version 3.01b" calibrations. The hand held unit indicates to the technician that there are newer calibrations in the memory card, and asks him if he would like to proceed with downloading these new calibrations to the anti-lock controller. He responds "yes", and the hand held tool programs the anti-lock controller's flash memory with the new calibrations. The controller sends a message to the hand held tool, which is displayed for the technician, indicating the update was successful.

The service manager next asks the technician to take an inventory of the stock room and order sufficient supplies for the next two weeks. After checking the inventory, the technician goes to the master station and places an order for air filters using the telephone link to the central warehouse from the on-line parts catalog menu. He then tells the manager that the order has been placed and the parts are scheduled to arrive next Tuesday.

It can be appreciated from the foregoing discussion that the system and method of the present invention is suited for use in a wide variety of applications. Therefore, one of ordinary skill in the art could readily adapt the concepts disclosed herein for use on any particular application.

We claim:

1. A hand-held service tool for monitoring an operation of a vehicle and for diagnosing problems with the operation of the vehicle, the vehicle having at least one on-board controller for controlling the operation of the vehicle, said on-board controller having a communication bus for communicating with external devices and with other on-board vehicle systems, said communication bus having a predetermined unique communication protocol, said service tool comprising:

at least one connection port for receiving a communication cable, said communication cable having two ends where one end is connected to said service tool at said connection port and the other end is connected to the vehicle at a connection port on said vehicle communication bus;

detection means integral with said service tool and connected to said service tool connection port for identifying said communication cable, wherein said detection means identifies unique electrical characteristics of the connected communication cable;

protocol means responsive to a signal from said detection means for matching a communication protocol of said service tool with a communication bus protocol associated with the communication bus which is connected to the detected communication cable; and logic means for sending inquiry commands to said vehicle controller from said service tool via said communication cable over said vehicle bus using said communication bus protocol, said inquiry commands causing said vehicle controller to communicate vehicle operational information to said service tool via said communication cable over said communication bus.

2. A service tool as set forth in claim 1 adapted for monitoring the operation of more than one vehicle, each vehicle having on-board controllers and communication buses having protocols unique from one another, there existing more than one communication cable suitable for being received at said service tool connection port, each said communication cable having unique electrical characteristics from each other and suitable for use with one or more of said vehicles, wherein once a vehicle is selected for monitoring and one of the corresponding communication cables is connected to said service tool and said vehicle communication bus, said detection means further identifies said unique electrical characteristics of said connected cable whereby said protocol means matches the communication protocol unique to the selected vehicle.

3. The invention according to claim 1, wherein said service tool includes means for causing service history information to be stored in said on-board controller.

4. The invention according to claim 3, wherein said means for causing service history information to be stored in said on-board controller includes key pad means on said service tool for entering said service history information, display panel means on said service tool for displaying said service history information as it is being entered from said key pad means, and signal conveying means for transmitting said entered service history information from said service tool to said on-board controller through said communication cable.

5. The invention according to claim 1, wherein said service tool includes key pad means for directing the operation of said service tool, display panel means for displaying information in response to the operation of said service tool, logic means for enabling the user to create custom templates of only selected parameters to be displayed on said display panel means and for storing said custom templates for future use.

6. The invention according to claim 1, wherein said service tool includes key pad means for directing the operation of said service tool, display panel means for displaying information in response to the operation of said service tool, page means for enabling the user to back track through a diagnostic procedure in order to modify an earlier diagnostic selection.

7. A hand held service tool for monitoring an operation of a vehicle and for diagnosing problems with the operation of the vehicle, the vehicle having at least one on-board controller for controlling the operation of the vehicle, said on-board controller having a communication bus, said service tool comprising:

at least one connection port for receiving a communication cable having two ends wherein one end is connected to said service tool at said connection port and the other end is connected to said vehicle at a connection port on said vehicle communication bus;

at least one measuring circuit for measuring at least one of a voltage across and a current through at least one electrical circuit component on the vehicle;

two sets of input probes connected to both said measuring circuit and said electrical circuit component; and display screen means for displaying voltage and current data received from said measuring circuit.

8. A method of operating a service tool for monitoring an operation of a vehicle and for diagnosing problems with the operation of the vehicle, the vehicle having at least one on-board controller for controlling the operation of the vehicle, said on-board controller having a communication bus for communicating with external devices and with other on-board vehicle systems, said service tool including an off-board controller having a memory means and a display screen, communication means connecting said service tool to said vehicle communication bus, said method of operating comprising the steps of:

automatically determining an appropriate communication protocol for communication between said on-board controller and said off-board controller based upon a parameter associated with said communication means, wherein said parameter includes unique electrical characteristics;

transmitting vehicle trouble code date to said service tool from said on-board controller via said communication means using said determined communication protocol;

erasing at least one vehicle trouble code at said on-board controller responsive to a command signal input to said service tool in response to a diagnosis decision corresponding to said vehicle trouble code data; and storing in said on-board controller service history information from said service tool.

* * * * *